United States Patent [19]

Cleeves et al.

[11] Patent Number: 4,883,772

[45] Date of Patent: Nov. 28, 1989

[54] PROCESS FOR MAKING A SELF-ALIGNED SILICIDE SHUNT

[75] Inventors: James M. Cleeves, Redwood City; James G. Heard, Cupertino, both of Calif.

[73] Assignee: National Semiconductor Corporation, Santa Clara, Calif.

[21] Appl. No.: 241,784

[22] Filed: Sep. 6, 1988

Related U.S. Application Data

[63] Continuation of Ser. No. 122,523, Nov. 18, 1987, abandoned, which is a continuation of Ser. No. 906,350, Sep. 11, 1986, abandoned.

[51] Int. Cl.[4] .......................................... H01L 21/283
[52] U.S. Cl. .................................... 437/200; 437/193; 437/194; 437/33; 437/984; 148/DIG. 19; 148/DIG. 105; 156/657
[58] Field of Search .................. 437/31, 32, 33, 69, 437/200, 192, 193, 194; 156/657, 653; 748/DIG. 19, DIG. 105, DIG. 123, DIG. 124

[56] References Cited

U.S. PATENT DOCUMENTS

| | | | |
|---|---|---|---|
| 4,128,845 | 12/1978 | Sakai | 357/51 |
| 4,188,707 | 2/1980 | Asano et al. | 29/571 |
| 4,199,380 | 4/1980 | Farrell et al. | 357/34 |
| 4,423,548 | 1/1984 | Hulseweh | 29/591 |
| 4,531,282 | 7/1985 | Sakai et al. | 357/34 |
| 4,581,319 | 4/1986 | Wieder et al. | 148/188 X |

FOREIGN PATENT DOCUMENTS

| | | |
|---|---|---|
| 0110211 | 6/1984 | European Pat. Off. |
| 0159179 | 10/1985 | European Pat. Off. |
| 0168324 | 1/1986 | European Pat. Off. |
| 0040980 | 3/1977 | Japan ..................... 357/59 |
| 0148863 | 11/1981 | Japan ..................... 357/59 |
| 2157079 | 10/1985 | United Kingdom ........... 357/34 |
| 2168845 | 6/1986 | United Kingdom . |

OTHER PUBLICATIONS

Tang et al., "Subnanosecond Self-Aligned I²L/MTL Circuits" *IEEE Trans. Elect. Devices*, vol. ED. 27, No. 8, Aug. 1980, pp. 1379-1384.

Blakeslee et al., "Aluminum Etch Mask for Plasma Etching" *IBM Tech. Ins. Bull.*, vol. 21, No. 3, Aug. 1978, pp. 1256-1258.

*Primary Examiner*—Brian E. Hearn
*Assistant Examiner*—T. N. Quach
*Attorney, Agent, or Firm*—Lee Patch; Robert C. Colwell; James M. Heslin

[57] ABSTRACT

A silicide base shunt 50 and method of fabricating it are disclosed for a bipolar transistor. The base shunt 50 is fabricated using the first layer metal 36, 39 as a mask to etch silicon dioxide 27 surrounding the emitter 34 to thereby expose the underlying silicon epitaxial layer 24. Nickel or copper are then deposited onto the silicon 24 to form a region of silicide 50 extending from a base contact 36 to closely proximate the emitter 34, thereby minimizing the resistance of the extrinsic base region 24 of the transistor.

12 Claims, 3 Drawing Sheets

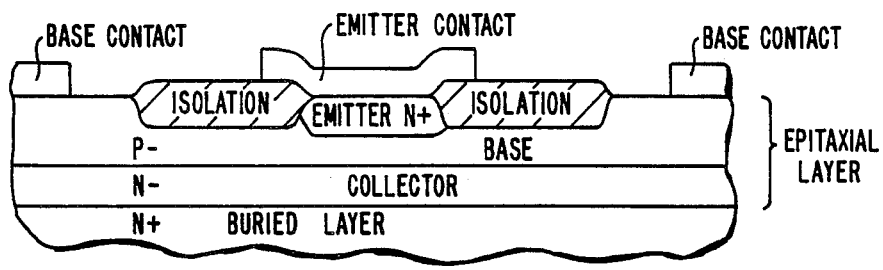
FIG._1a.(PRIOR ART)
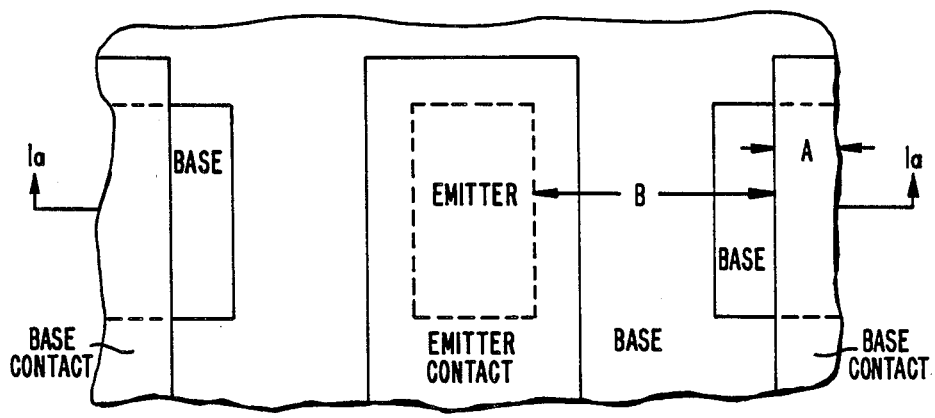
FIG._1b. (PRIOR ART)

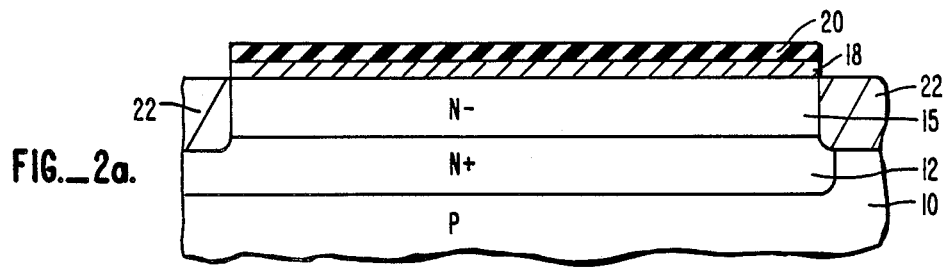
FIG._2a.
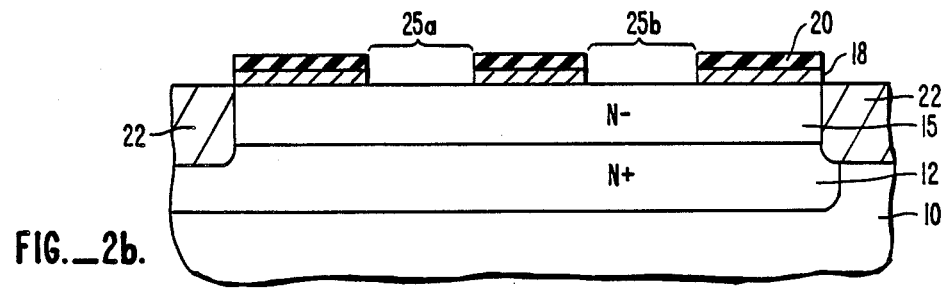
FIG._2b.
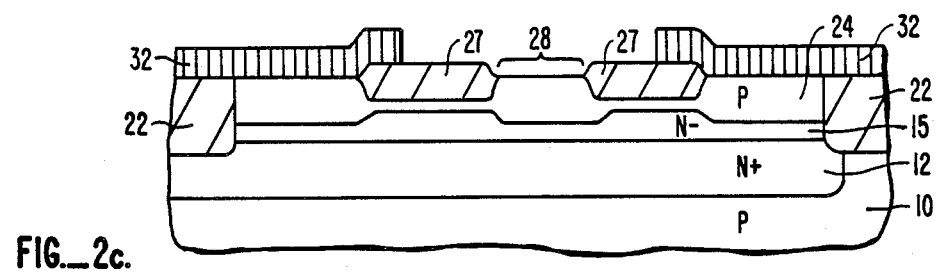
FIG._2c.
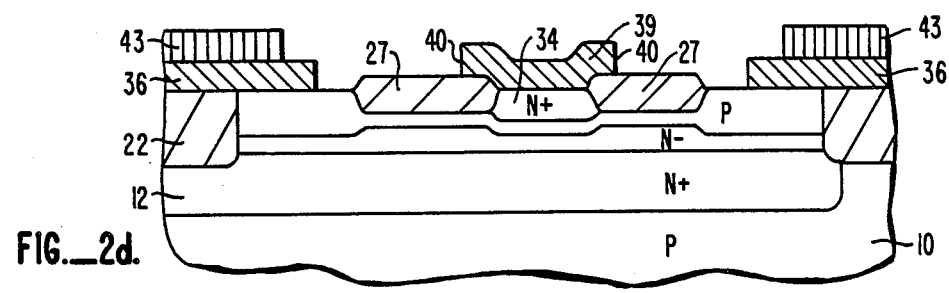
FIG._2d.

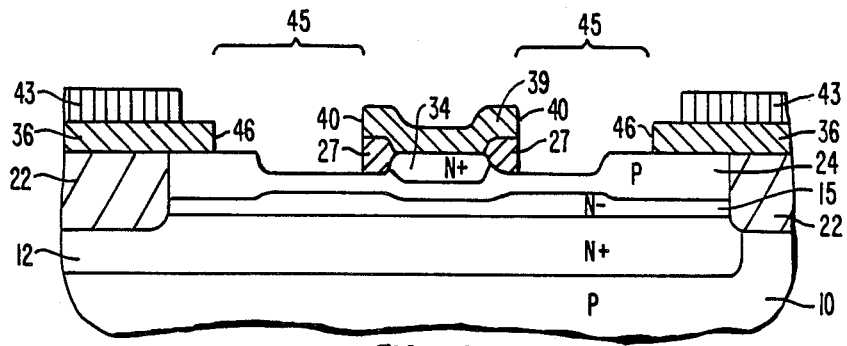
FIG._2e.
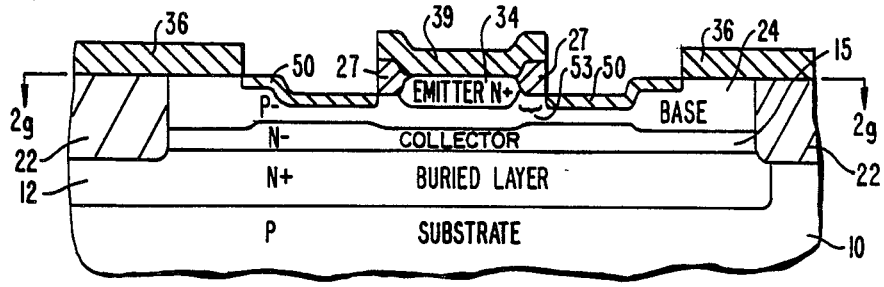
FIG._2f.
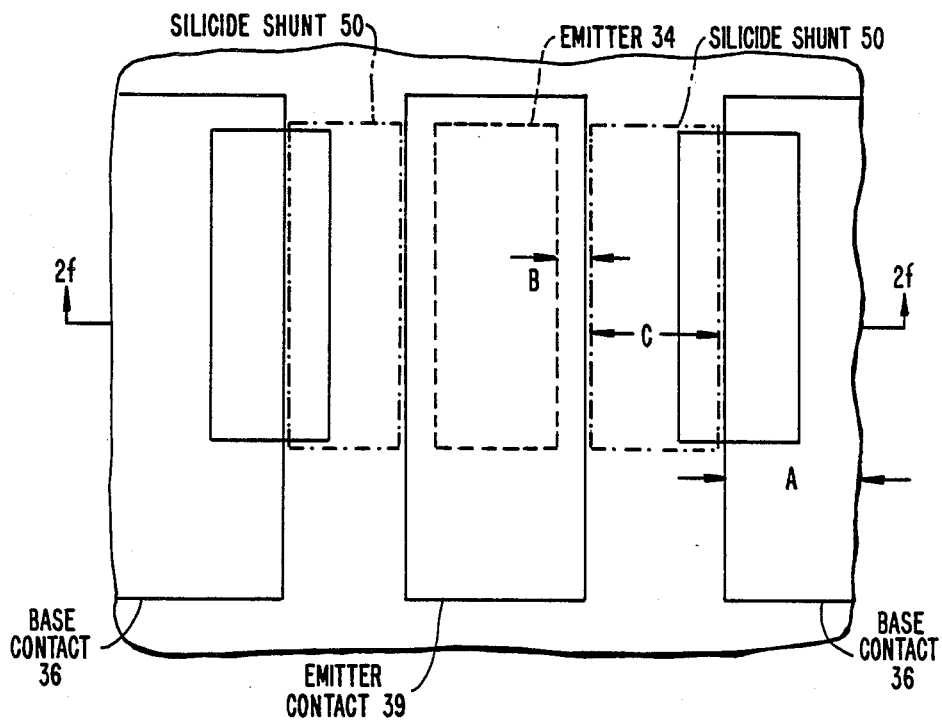
FIG._2g.

PROCESS FOR MAKING A SELF-ALIGNED SILICIDE SHUNT

This is a continuation of Ser No. 122,523, filed 11/18/87, now abandoned, which is a continuation of Ser. No. 906,350, filed 9/11/86, now abandoned.

BACKGROUND OF THE INVENTION

1. Field of the Invention

This invention relates to integrated circuits and the manufacture thereof, and particularly to the fabrication of a low resistance base shunt for a bipolar transistor extending from a base contact into close proximity with an emitter region.

2. Description of the Prior Art

Integrated circuit designers are faced with the difficult task of fabricating circuits which operate at the highest possible speed while occupying a minimal amount of the silicon surface area. As semiconductor structures have become increasingly complex, it is difficult to fabricate all of the necessary active and passive devices within the integrated circuit in a reasonable number of process steps with a minimal number of masks, while achieving the desired performance.

One well known integrated circuit fabrication technology is the manufacture of bipolar transistors. A widely used and well known process for fabricating bipolar transistors is described in U.S. Pat. No. 3,648,125 entitled "Method of Fabricating Integrated Circuits with Oxidized Isolation and the Resulting Structure" and issued to Douglas L. Peltzer. Peltzer teaches the use of oxide isolation to provide electrically isolated pockets of epitaxial silicon in which active and/or passive devices may be fabricated. These individual devices are then interconnected by metal or polysilicon conductors deposited across the surface of the silicon. Numerous other oxide isolated bipolar processes have been developed. In almost all of these processes, it is desired to make the transistor switch as rapidly as possible. One well known restriction on the switching speed of bipolar devices is the resistance presented by the extrinsic base region, that is, for a vertical device that portion of the base extending laterally between the emitter and the base contact.

FIG. 1a is a cross-sectional view of a portion of a prior art semiconductor structure. The structure depicted is a cross-section of a vertical NPN transistor. As shown, a buried layer of strongly-doped N conductivity provides a collector region under an epitaxial silicon layer. The collector is separated from the strongly-doped emitter by a base region. An emitter contact provides an electrical connection to the emitter, while a pair of base contacts provide electrical connections to the base. The emitter contact is prevented from shorting to the base region by an annular thin oxide isolation region surrounding the emitter at the upper surface of the epitaxial layer.

FIG. 1b is a top view of the structure shown in FIG. 1a, and illustrates a significant disadvantage of the structure. In particular, the transistor structure of FIG. 1a will not switch as rapidly as desired because of the relative high resistance of the extrinsic base region. The extrinsic base region is that portion of the base extending between the emitter and the base contact. As shown in FIG. 1b, the sheet resistance A of the base contact will be on the order of 0.03 ohms per square, while the sheet resistance of the extrinsic base B will on the order of 700 ohms per square. The relatively high resistance B reduces the switching speed of the transistor.

At least two techniques have been developed for lowering the resistance of the extrinsic base. According to one technique, a plug implant is employed to extend the base downward and thereby increase the collector-base capacitance. The capacitance is increased because the base region is more strongly doped in closer proximity to the collector region.

When a polycrystalline silicon contact is employed, another prior art technique for lowering the resistance of the extrinsic base is to form a spacer oxide on the sides of the polycrystalline silicon contact, and then use the spacer oxide to mask additional implantation of the substrate with base impurity to thereby more strongly dope all of the base region except that portion beneath the emitter contact and spacer oxide.

SUMMARY OF THE INVENTION

We have developed a technique for lowering the resistance of the extrinsic base of a bipolar transistor by using a low resistance base shunt employing metal silicide. The shunt is fabricated by a self-aligned masking process in which metal or other contacts fabricated on the surface of the semiconductor are employed as a mask. The invention is particularly advantageous because it provides increased switching speeds in a highly reliable manner with a minimal number of additional masks and fabrication steps. The invention also allows the base shunt to be positioned substantially closer to the emitter of a vertical bipolar transistor than one minimum line width.

Our invention includes both a process and the resulting semiconductor structure. In a preferred embodiment, a process for fabricating the low resistance shunt of our invention consists of the steps of: in a layer of first conductivity type semiconductor material having a surface, forming an insulating region of oxidized semiconductor material to separate, at the surface, a first portion of the layer from a second portion of the layer; introducing opposite conductivity type impurity into the first portion to thereby form a doped region; forming a first electrical connection to the doped region, which connection extends outward at least over a part of the insulating region; using the electrical connection as a mask, removing a part of the insulating region to expose the surface of the layer; and depositing a silicide-forming metal onto at least the surface of the layer to thereby form a low resistance shunt of metal silicide.

In most embodiments the first portion of the layer will be the emitter and the second portion the extrinsic base, while aluminum is employed as the electrical contact. By using an anisotropic etching process which attacks silicon dioxide, but not silicon or aluminum, the aluminum contacts mask the silicon dioxide. Thus, all of the silicon dioxide except a small region beneath the emitter contact and adjacent the emitter will be removed. A layer of silicide-forming metal may then be deposited onto the now nearly completely exposed extrinsic base. By employing a metal, such as nickel or copper, which forms silicide below the melting point of aluminum, the silicide may be formed without destroying the interconnections. Unreacted metal may then be selectively etched from the structure.

The process of our invention results in a unique structure. In a preferred embodiment, a semiconductor structure fabricated according to our invention includes a layer of first conductivity type semiconductor material having an upper surface; a first doped region of opposite conductivity type extending into the layer from the surface; an electrical connection to the first region disposed over the surface to contact only the first region, an overhanging portion of the electrical connection having an edge extending beyond the first region over the layer, but separated therefrom; a first insulating region disposed between the overhanging portion of the electrical connection and the layer and having an edge, the edge of the electrical connection and the edge of the insulating region being aligned, one atop the other; and a silicide region extending into the layer adjacent the insulating region, the silicide region also including an edge aligned with the edge of the insulating region. In a preferred embodiment, another edge of the silicide region will correspond with an edge of an additional electrical connection to the layer itself. As with the process of our invention, the first doped region typically will be an emitter, while the silicide will comprise copper or nickel.

BRIEF DESCRIPTION OF THE DRAWINGS

FIG. 1a is a cross-sectional view of a prior art semiconductor structure;

FIG. 1b is a top view of the structure of FIG. 1a illustrating the high extrinsic base resistance of the structure;

FIGS. 2a-2g illustrate a preferred embodiment of the process of our invention where:

FIG. 2a is a cross section of the semiconductor structure after formation of oxidized isolation regions;

FIG. 2b is a subsequent cross section after definition of oxide and nitride masking layers;

FIG. 2c is a subsequent cross section after additional oxidation of the epitaxial layer and formation of a mask;

FIG. 2d is a subsequent cross section after formation of an emitter and electrical contacts to the base and emitter, as well as fabrication of another mask;

FIG. 2e is a subsequent cross section after use of the metal contacts as a mask to etch the underlying structure;

FIG. 2f is a subsequent cross section after formation of the silicide base shunts; and FIG. 2g is a top view of the structure shown in FIG. 2f.

DETAILED DESCRIPTION OF THE PREFERRED EMBODIMENTS

FIGS. 2a-2g illustrate a preferred embodiment of the process of our invention, and the resulting structure. For clarity the vertical dimension in the figures is exaggerated. FIG. 2a is a cross-sectional view of one well known semiconductor structure which may be used as a starting point for the process of our invention. The structure shown in FIG. 2a includes a P conductivity type silicon substrate 10 having a conductivity of approximately 1-20 ohm centimeters. Inset into the surface of substrate 10 is a strongly-doped N conductivity type buried layer 12 having conductivity on the order of 3-10 ohms. Buried layer 12 will provide a buried connection to the collector region of a vertical NPN transistor. On the upper surface of buried layer 12, a lightly-doped N conductivity type epitaxial layer 15 is deposited, using well known semiconductor manufacturing techniques. Epitaxial layer 15 will have conductivity on the order of 0.5-3.0 ohms. Across the upper surface of layer 15, a relatively thin layer of silicon dioxide 18, on the order of 150-500 Angstroms thick, is grown using standard techniques. The choice of precise conductivities, thicknesses, etc., will depend upon the use to which the completed device will be applied.

On the upper surface of silicon dioxide layer 18, a layer of silicon nitride 20 is deposited, preferably using chemical vapor deposition. Nitride layer 20 typically will be 1000-2000 Angstroms thick. Using well known semiconductor photolithographic fabrication techniques and etchants, oxide and nitride layers 18 and 20 are patterned to expose regions of the underlying epitaxial layer 15 wherever insulating layers are desired. The structure is then oxidized using well known techniques to create oxidized isolation regions 22. If desired, a silicon etch and channel stop may precede the oxidation.

In the preferred embodiment silicon dioxide isolation 22 extends annularly through the epitaxial layer, around the portion of epitaxial layer 15 depicted, thereby creating an isolated pocket within which active and/or passive circuit components may be formed. At a cross section not depicted in the figures, but typically in the same silicon island, a contact will be formed to extend downward to connect to buried layer 12, thereby providing a buried connection (via buried layer) 12 to that lower portion of layer 15 which will eventually become the collector of the bipolar transistor. The process just described is discussed in further detail in the Peltzer patent referred to above. As will be evident, other isolation processes could also be employed.

FIG. 2b is a subsequent cross-sectional view. Following the process described in FIG. 2a, layers 18 and 20 are patterned to expose the upper surface of portions 25a and 25b of layer 15, whereby additional oxidized silicon is desired, for example, for a walled emitter structure. This may be achieved by using well known photolithographic techniques followed by wet or dry etches which attack the appropriate materials.

As next shown in FIG. 2c, the structure is oxidized to form silicon dioxide region 27. Region 27, typically annular, will surround or separate a portion 28 of the surface of layer 15 from other portions of layer 15. The remaining silicon dioxide 18 and silicon nitride 20 is removed from the structure using conventional etchants. Then a layer of photoresist 32 is deposited and defined to expose the collector sink (not shown) which is doped with N-type impurity.

The photoresist is stripped and a new layer (not shown) deposited which exposes selected portions of layer 15 which will become the base regions of the transistor. Using this mask, a base region 24 is implanted into the upper surface of epitaxial layer 15. In the preferred embodiment, base region 24 is formed by implanting boron ions into the structure.

As shown in FIG. 2c, the mask is removed and another photoresist mask 32 is defined. Suitable N conductivity type impurity, for example, arsenic, is introduced to create the walled emitter region 34 (see FIG. 2d). In the preferred embodiment emitter 34 is doped to a concentration of $1 \times 10^{20}$ atoms per cubic centimeter. Next, as also shown in FIG. 2d, a layer of electrically conductive material 36 is deposited across the structure and defined into base 36 and emitter 39 contacts. Importantly, edges 40 of layer 39 extend beyond the edges of emitter 34 onto silicon dioxide regions 27. This is a result of the original layout of the structure.

In the preferred embodiment, contacts 36 and 39 are aluminum on the order of 5000-10000 Angstroms thick. Typically, the aluminum will include small amounts of copper, to minimize electromigration, and silicon, to minimize dissolution of the silicon substrate into the aluminum at the time of contact deposition. In another embodiment of the invention, however, contacts 36, 39 will comprise polycrystalline silicon doped with suitable impurity during or after deposition to render it sufficiently conductive.

After the conductive layer is patterned to define contacts 36 and 39, an additional layer of photoresist 43 is deposited across the structure and defined as shown, in FIG. 2d. The photoresist 43 will protect otherwise exposed regions of the semiconductor structure from subsequent processing steps.

FIG. 2e illustrates the next stage of our process. Using electrically conductive regions 36 and 39 as a mask, exposed portions of silicon dioxide region 27 are etched from the surface of the structure. In the preferred embodiment, this is achieved by employing commercially available fluorine based plasma. The plasma does not attack aluminum, silicon, or photoresist, but does attack silicon dioxide. The silicon dioxide is etched for a sufficient period (dependent on its thickness) to etch completely through regions 27 to expose the underlying portions of the base region 24. In this manner any silicon dioxide within regions 45 will be removed, with the edges 40 and 46 of connections 39 and 36, respectively, defining the width of the region to be etched. After etching, the structure will appear as depicted in FIG. 2e, that is, an overhanging portion of connection 39 will extend beyond the edges of emitter 34, yet be separated from the base region 24 by small remaining silicon dioxide regions 27.

FIG. 2f depicts the next steps in our process. A silicide-forming metal is deposited across the entire upper surface of the structure, including the newly exposed upper surface of the extrinsic base 24. The structure is then heated to a temperature sufficient to cause the metal to react with the underlying silicon to form metal silicide regions 50. Importantly, in the preferred embodiment a metal such as nickel or copper is employed which forms a silicide at a sufficiently low temperature so as not to melt the aluminum interconnections 36 and 39 already in place. Once the silicide has been formed, unreacted metal which remains on aluminum 36 or 39, or on the sides of region 27, may be stripped with an appropriate etchant, for example, dilute nitric acid for nickel or copper. If polysilicon contacts are employed in place of aluminum, the suitable metals for silicide formation include platinum, paladium, titanium, and tungsten, as well as others.

In the embodiment where connections 36 and 39 are polysilicon, the deposited metal will react with the polysilicon to form a region of metal silicide on the upper surface of connections 36 and 39, thereby diminishing their resistance. As described above, any metal deposited on silicon dioxide 27, or other regions not depicted in the figures, may be removed using an appropriate etchant.

The result of our described process is to create the structure shown in FIG. 2f. As shown, a low resistance metal silicide shunt 50 extends from the base contact 36 toward emitter 34. Shunt 50 extends to within a very short distance 53 of emitter 34, thereby substantially minimizing the extrinsic base resistance. Distance 53 will be determined by the extent to which silicon dioxide 27 encroaches beneath the mask formed by oxide 18 and nitrite 20, by the extent to which the emitter 34 diffuses beneath and beyond the tip of that encroachment, and by the designed overlap of the contact metal over the oxide.

FIG. 2g is a top view of the structure shown in FIG. 2f. The emitter contact 39 is shown overlying emitter 34 and extending beyond the periphery of emitter 34. Also shown are the base shunt 50 and base contacts 36. The particular advantage of the base shunt may be appreciated by comparing FIG. 1b with FIG. 2g. The dimension B of the extrinsic base has been substantially reduced. Most of the distance B+C between the base contact 36 and the edge of emitter 34 is now occupied by the silicide shunt 50. The resistivity of the silicide shunt 50 will be on the order of 1–20 ohms per square, in contrast with the resistance of about 200–2000 ohms per square for the extrinsic base. This substantial decrease in resistance of the extrinsic base allows the transistor to switch at higher speeds than transistors formed without the silicide shunt.

Although preferred embodiments of the invention have been described above, these embodiments are for the purpose of explaining the invention and not to limit it. The scope of the invention may be ascertained from the appended claims.

We claim:

1. A process for fabricating a low resistance shunt for a silicon semiconductor structure comprising:
   on a layer of first conductivity type silicon semiconductor material having a surface, forming a masking region over a first portion of the surface but not over a second portion;
   oxidizing the second portion to form an insulating region of oxidized silicon semiconductor material to separate at the surface the first portion of the layer from the second portion, the insulating region encroaching beneath the masking region to thereby reduce the size of the first portion;
   in predetermined order (a) removing the masking region and (b) introducing opposite conductivity type impurity into the first portion to thereby form a first region;
   subsequently forming a first electrical connection to the first region, which connection extends at least over the part of the insulating region which was encroaching beneath the masking region;
   forming a second electrical connection over the layer of first conductivity type semiconductor material, which second electrical connection is spaced apart from the first electrical connection;
   using the first and second electrical connections as a mask, removing a part of the insulating region to expose the surface of the first conductivity layer while leaving at least that portion of the insulating layer encroaching beneath the masking region; and
   depositing a silicide-forming metal onto at least the surface of the layer to form a low resistance shunt of metal silicide between said first and second electrical connections.

2. A process as in claim 1 wherein the first electrical connection comprises aluminum.

3. A process as in claim 2 wherein the silicide-forming metal comprises copper.

4. A process as in claim 2 wherein the silicide-forming metal comprises nickel.

5. A process as in claim 1 wherein the first electrical connection comprises polycrystalline silicon.

6. A process as in claim 1 whereinthe step of removing a part of the insulating region comprises etching the insulating region with a fluorine containing plasma.

7. A process as in claim 1 wherein the opposite conductivity type impurity comprises N conductivity type and the doped region comprises an emitter of a transistor.

8. A process as in claim 1 wherein the step of depositing is followed by the step of heating the semiconductor structure to cause the silicide-forming metal to react with the layer.

9. A process as in claim 8 wherein the first electrical connection has a melting point and the structure is heated to a temperature below the melting point of the first electrical connection.

10. A process as in claim 9 followed by the step of removing from the structure any of the silicide-forming metal which does not react with the silicon layer.

11. A process as in claim 10 wherein the silicide-forming metal comprises nickel and the step of removing comprises etching with dilute nitric acid.

12. A process for fabricating a low resistance silicide shunt for a vertical bipolar transistor comprising:

in a layer of P conductivity type silicon semiconductor material having an upper surface, forming an insulating region of oxidized silicon to separate at the surface of the layer an emitter regio from a base region;

introducing N conductivity type impurity into the emitter region to thereby form an emitter;

forming a first aluminum connection to the emitter, which connection extends at least over a part of the oxidized silicon;

forming a second aluminum connection on the upper surface of the P conductivity type silicon semiconductor material, said second aluminum connection being spaced-apart from the first aluminum connection;

using the first and second aluminum connections as a mask, plasma etching the oxidized silicon to expose the surface of the silicon layer except where protected by the aluminum connections;

depositing a metal selected from the group of copper and nickel across the silicon;

heating the metal to a temperature below the melting point of aluminum to thereby form the low resistance silicide shunt; and removing any of the silicide-forming metal remaining unreacted on the semiconductor structure.

* * * * *